United States Patent
Chen et al.

(10) Patent No.: US 8,956,943 B2
(45) Date of Patent: Feb. 17, 2015

(54) METHOD FOR MANUFACTURING NON-VOLATILE MEMORY

(71) Applicant: United Microelectronics Corporation, Hsinchu (TW)

(72) Inventors: Chien-Hung Chen, Hsinchu (TW); Tzu-Ping Chen, Hsinchu (TW); Yu-Jen Chang, Taipei County (TW)

(73) Assignee: United Microelectronics Corporation, Hsinchu (TW)

( * ) Notice: Subject to any disclaimer, the term of this patent is extended or adjusted under 35 U.S.C. 154(b) by 0 days.

(21) Appl. No.: 13/902,866

(22) Filed: May 27, 2013

(65) Prior Publication Data

US 2013/0260524 A1    Oct. 3, 2013

Related U.S. Application Data

(62) Division of application No. 12/843,093, filed on Jul. 26, 2010, now Pat. No. 8,471,328.

(51) Int. Cl.

| | |
|---|---|
| *H01L 21/331* | (2006.01) |
| *H01L 29/792* | (2006.01) |
| *H01L 21/28* | (2006.01) |
| *H01L 27/115* | (2006.01) |
| *H01L 29/423* | (2006.01) |
| *H01L 29/66* | (2006.01) |

(52) U.S. Cl.
CPC ........ *H01L 29/792* (2013.01); *H01L 21/28282* (2013.01); *H01L 27/11573* (2013.01); *H01L 29/4234* (2013.01); *H01L 29/66833* (2013.01)
USPC ........... 438/303; 438/149; 438/261; 257/326; 257/204; 257/314; 257/E21.423

(58) Field of Classification Search
CPC ............ H01L 27/14603; H01L 27/146; H01L 27/14605; H01L 27/14643; H01L 27/222
USPC ............ 257/225, E27.151, 324, 30; 438/149, 438/261, 303
See application file for complete search history.

(56) References Cited

U.S. PATENT DOCUMENTS

| | | |
|---|---|---|
| 5,065,362 A | 11/1991 | Herdt et al. |
| 5,828,599 A | 10/1998 | Herdt |
| 5,963,465 A | 10/1999 | Eitan |
| 5,966,603 A | 10/1999 | Eitan |
| 6,144,580 A | 11/2000 | Murray |
| 6,163,048 A | 12/2000 | Hirose et al. |
| 6,172,907 B1 | 1/2001 | Jenne |
| 6,214,668 B1 | 4/2001 | Hsu et al. |
| 6,215,148 B1 | 4/2001 | Eitan |

(Continued)

*Primary Examiner* — Elias M Ullah
(74) *Attorney, Agent, or Firm* — Ding Yu Tan

(57) ABSTRACT

A method for manufacturing a non-volatile memory is disclosed. A gate structure is formed on a substrate and includes a gate dielectric layer and a gate conductive layer. The gate dielectric layer is partly removed, thereby a symmetrical opening is formed among the gate conductive layer, the substrate and the gate dielectric layer, and a cavity is formed on end sides of the gate dielectric layer. A first oxide layer is formed on a sidewall and bottom of the gate conductive layer, and a second oxide layer is formed on a surface of the substrate. A nitride material layer is formed covering the gate structure, the first and second oxide layer and the substrate and filling the opening. An etching process is performed to partly remove the nitride material layer, thereby forming a nitride layer on a sidewall of the gate conductive layer and extending into the opening.

20 Claims, 16 Drawing Sheets

(56) References Cited

U.S. PATENT DOCUMENTS

| | | |
|---|---|---|
| 6,297,096 B1 | 10/2001 | Boaz |
| 6,348,711 B1 | 2/2002 | Eitan |
| 6,349,055 B1 | 2/2002 | Murray |
| 6,418,060 B1 | 7/2002 | Yang et al. |
| 6,441,443 B1 | 8/2002 | Hsu et al. |
| 6,448,607 B1 | 9/2002 | Hsu et al. |
| 6,449,191 B1 | 9/2002 | Lin et al. |
| 6,469,930 B1 | 10/2002 | Murray |
| 6,477,084 B1 | 11/2002 | Eitan |
| 6,489,202 B1 | 12/2002 | Hsu et al. |
| 6,490,196 B1 | 12/2002 | Hsu et al. |
| 6,501,685 B2 | 12/2002 | Hsu et al. |
| 6,518,126 B2 | 2/2003 | Wu et al. |
| 6,532,169 B1 | 3/2003 | Mann et al. |
| 6,534,817 B2 | 3/2003 | Hsu et al. |
| 6,555,865 B2 | 4/2003 | Lee et al. |
| 6,570,809 B1 | 5/2003 | Lin |
| 6,580,641 B2 | 6/2003 | Wu et al. |
| 6,580,645 B1 | 6/2003 | Lin et al. |
| 6,580,658 B1 | 6/2003 | Hsu et al. |
| 6,586,968 B1 | 7/2003 | Schauer et al. |
| 6,608,530 B1 | 8/2003 | Green et al. |
| 6,614,070 B1 | 9/2003 | Hirose et al. |
| 6,628,548 B1 | 9/2003 | Hsu et al. |
| 6,654,284 B2 | 11/2003 | Hsu et al. |
| 6,664,588 B2 | 12/2003 | Eitan |
| 6,674,665 B1 | 1/2004 | Mann et al. |
| 6,677,198 B2 | 1/2004 | Hsu et al. |
| 6,677,213 B1 | 1/2004 | Ramkumar et al. |
| 6,709,928 B1 | 3/2004 | Jenne et al. |
| 6,710,397 B1 | 3/2004 | Hsu et al. |
| 6,717,206 B2 | 4/2004 | Hsu et al. |
| 6,734,740 B1 | 5/2004 | Green et al. |
| 6,750,504 B2 | 6/2004 | Yang et al. |
| 6,768,678 B1 | 7/2004 | Hsu et al. |
| 6,771,543 B2 | 8/2004 | Wong et al. |
| 6,774,433 B2 | 8/2004 | Lee et al. |
| 6,785,169 B1 | 8/2004 | Nemati et al. |
| 6,787,419 B2 | 9/2004 | Chen et al. |
| 6,794,711 B2 | 9/2004 | Kang et al. |
| 6,801,456 B1 | 10/2004 | Hsu et al. |
| 6,803,279 B2 | 10/2004 | Eitan |
| 6,806,517 B2 | 10/2004 | Kim et al. |
| 6,815,764 B2 | 11/2004 | Bae et al. |
| 6,818,558 B1 | 11/2004 | Rathor et al. |
| 6,819,620 B2 | 11/2004 | Lin et al. |
| 6,828,201 B1 | 12/2004 | Ramkumar |
| 6,835,621 B2 | 12/2004 | Yoo et al. |
| 6,844,589 B2 | 1/2005 | Kim |
| 6,847,087 B2 | 1/2005 | Yang et al. |
| 6,847,556 B2 | 1/2005 | Cho |
| 6,850,442 B2 | 2/2005 | Tsai et al. |
| 6,867,453 B2 | 3/2005 | Shin et al. |
| 6,881,626 B2 | 4/2005 | Lee et al. |
| 6,885,585 B2 | 4/2005 | Maayan et al. |
| 6,888,757 B2 | 5/2005 | Lusky et al. |
| 6,894,924 B2 | 5/2005 | Choi et al. |
| 6,897,533 B1 | 5/2005 | Yang et al. |
| 6,904,497 B1 | 6/2005 | Beckett |
| 6,917,544 B2 | 7/2005 | Maayan et al. |
| 6,927,131 B2 | 8/2005 | Kim |
| 6,946,703 B2 | 9/2005 | Ryu et al. |
| 6,954,382 B2 | 10/2005 | Maayan et al. |
| 6,954,393 B2 | 10/2005 | Lusky et al. |
| 6,960,527 B2 | 11/2005 | Kang |
| 6,975,536 B2 | 12/2005 | Maayan et al. |
| 7,005,349 B2 | 2/2006 | Lee et al. |
| 7,009,882 B2 | 3/2006 | Chen |
| 7,037,781 B2 | 5/2006 | Choi et al. |
| 7,042,054 B1 | 5/2006 | Ramkumar et al. |
| 7,045,424 B2 | 5/2006 | Kim et al. |
| 7,049,189 B2 | 5/2006 | Chang et al. |
| 7,053,448 B2 | 5/2006 | Jeon et al. |
| 7,060,563 B2 | 6/2006 | Bae et al. |
| 7,064,378 B2 | 6/2006 | Jeon et al. |
| 7,076,703 B1 | 7/2006 | Le et al. |
| 7,091,090 B2 | 8/2006 | Choi |
| 7,116,577 B2 | 10/2006 | Eitan |
| 7,119,394 B2 | 10/2006 | Hsieh et al. |
| 7,123,532 B2 | 10/2006 | Lusky et al. |
| 7,136,304 B2 | 11/2006 | Cohen et al. |
| 7,141,473 B2 | 11/2006 | Jeon et al. |
| 7,148,110 B2 | 12/2006 | Jeon et al. |
| 7,179,709 B2 | 2/2007 | Kim et al. |
| 7,184,313 B2 | 2/2007 | Betser et al. |
| 7,187,030 B2 | 3/2007 | Chae et al. |
| 7,199,421 B2 | 4/2007 | Park et al. |
| 7,202,521 B2 | 4/2007 | Kim et al. |
| 7,223,659 B2 | 5/2007 | Shin et al. |
| 7,230,305 B2 | 6/2007 | Min et al. |
| 7,242,618 B2 | 7/2007 | Shappir et al. |
| 7,250,653 B2 | 7/2007 | Kim et al. |
| 7,256,444 B2 | 8/2007 | Choi et al. |
| 7,257,025 B2 | 8/2007 | Maayan et al. |
| 7,282,759 B2 | 10/2007 | Kim et al. |
| 7,315,055 B2 | 1/2008 | Cho et al. |
| 7,317,633 B2 | 1/2008 | Lusky et al. |
| 7,335,560 B2 | 2/2008 | Kim |
| 7,339,826 B2 | 3/2008 | Lusky |
| 7,349,262 B2 | 3/2008 | Jeong et al. |
| 7,361,560 B2 | 4/2008 | Lee et al. |
| 7,366,025 B2 | 4/2008 | Maayan |
| 7,374,991 B2 | 5/2008 | Ryu et al. |
| 7,439,574 B2 | 10/2008 | Kim et al. |
| 7,457,183 B2 | 11/2008 | Lusky et al. |
| 7,489,562 B2 | 2/2009 | Maayan et al. |
| 7,498,217 B2 | 3/2009 | Oh et al. |
| 7,505,303 B2 | 3/2009 | Ashokkumar et al. |
| 7,510,935 B2 | 3/2009 | Lee et al. |
| 7,511,334 B2 | 3/2009 | Lee et al. |
| 7,518,908 B2 | 4/2009 | Maayan et al. |
| 7,518,916 B2 | 4/2009 | Ashokkumar et al. |
| 7,531,870 B2 | 5/2009 | Kim et al. |
| 7,538,385 B2 | 5/2009 | Shin et al. |
| 7,539,054 B2 | 5/2009 | Ashokkumar et al. |
| 7,560,764 B2 | 7/2009 | Park et al. |
| 7,573,745 B2 | 8/2009 | Maayan et al. |
| 7,586,795 B2 | 9/2009 | Kutz et al. |
| 7,599,227 B2 | 10/2009 | Maayan |
| 7,638,835 B2 | 12/2009 | Irani et al. |
| 7,660,086 B2 | 2/2010 | Rodgers et al. |
| 7,675,775 B2 | 3/2010 | Scade et al. |
| 7,692,961 B2 | 4/2010 | Eitan et al. |
| 7,710,776 B2 | 5/2010 | Johal et al. |
| 7,714,379 B2 | 5/2010 | Lee |
| 7,738,304 B2 | 6/2010 | Maayan et al. |
| 7,742,339 B2 | 6/2010 | Rizel et al. |
| 7,755,938 B2 | 7/2010 | Atir et al. |
| 7,760,540 B2 | 7/2010 | Still |
| 7,760,554 B2 | 7/2010 | Eitan et al. |
| 7,768,061 B2 | 8/2010 | Jeon et al. |
| 7,786,512 B2 | 8/2010 | Bloom et al. |
| 7,787,303 B2 | 8/2010 | Jenne |
| 7,799,670 B2 | 9/2010 | Ramkumar et al. |
| 7,804,126 B2 | 9/2010 | Eitan et al. |
| 7,808,842 B1 | 10/2010 | Raghavan et al. |
| 2004/0183106 A1 | 9/2004 | Kim |
| 2005/0077566 A1 | 4/2005 | Zheng |

METHOD FOR MANUFACTURING NON-VOLATILE MEMORY

CROSS-REFERENCE TO RELATED APPLICATION

The present application is a divisional application of U.S. patent application Ser. No. 12/843,093 filed Jul. 26, 2010, now pending. The content of the above-mentioned patent application is hereby incorporated by reference herein in its entirety and made a part of this specification.

BACKGROUND OF THE INVENTION

1. Field of Invention

The present invention generally relates to a method for manufacturing non-volatile memory and particularly to a method for manufacturing a non-volatile memory formed with a SONOS structure.

2. Description of Related Art

A non-volatile memory has the advantages of the ability to perform multiple times of write, read or erase operation for data, and the stored data would not disappear after power down. The conventional non-volatile memory primarily uses polysilicon material as a charge storage layer thereof.

Owing to the characteristic of silicon nitride trapping electrons, in the conventional non-volatile memory technology, the silicon nitride is popularly used as the charge trap layer to replace a polysilicon floating gate. Generally, the silicon nitride is formed with two silicon oxides respectively disposed above and below the silicon nitride to serve as a charge tunnel layer and a charge block layer, and thereby forming a composite layer of oxide-nitride-oxide (ONO). Such type of non-volatile memory generally is termed as polysilicon/silicon oxide/silicon nitride/silicon oxide/silicon (SONOS) memory device.

According to different configuration locations of the silicon nitride charge trap layer, the SONOS memory devices can be classified into planar type and sidewall type. The silicon nitride charge trap layer of the planar type SONOS memory device is disposed between two silicon oxide layers, the two silicon oxide layers are formed with two silicon layers disposed above and below the two silicon oxide layers and respectively serving as a polysilicon gate (control gate) and a silicon substrate. However, the planar type SONOS memory device uses the ONO structure to replace the gate oxide layer and thus is incompatible with the current logic processes, and further would further increase the process complexity so that the efficiency of device is negatively affected or influenced.

In addition, the silicon nitride charge trap layer of the sidewall type SONOS memory device is disposed on the sidewall of the gate, or disposed on the sidewall of the gate and a part of the silicon substrate. Therefore, during the operation of the sidewall type SONOS memory device is in operation, electrons are necessarily required to be injected into the silicon nitride charge trap layer, which would easily encounter the issue of electron drift and influence the operation speed and charge storage capability of device.

SUMMARY OF THE INVENTION

The present invention is directed to a method for manufacturing a non-volatile memory, which can avoid the issue encountering of electron drift and would not negatively influence the efficiency of the non-volatile memory device, and especially can be compatible with the current logic processes but achieved without increase the device fabrication process complexity.

More specifically, a method for manufacturing a non-volatile memory in accordance with one embodiment of the present invention is provided. Firstly, a gate structure is formed on a substrate. The gate structure includes a gate dielectric layer and a gate conductive layer. Then, a part of the gate dielectric layer is removed, so that a symmetrical opening is formed among the gate conductive layer, the substrate and the gate dielectric layer, and a cavity is formed on two end sides of the gate dielectric layer. Afterwards, a first oxide layer is formed on a sidewall and bottom of the gate conductive layer, and a second oxide layer is formed on a surface of the substrate. Thereafter, a nitride material layer is formed covering the gate structure, the first oxide layer, the second oxide layer and the substrate and filling into the opening. Finally, an etching process is performed to remove a part of the nitride material layer, so that a nitride layer is formed on the sidewall of the gate conductive layer and extending into the opening.

In one embodiment, a step of removing the part of the gate dielectric layer is for example performing a wet etching process or a dry etching process.

In one embodiment, a step of forming the first oxide layer and the second oxide layer is for example performing an oxidation process.

In one embodiment, a step of forming the nitride material layer is for example a low pressure chemical vapor deposition method.

In one embodiment, after forming the nitride layer, two lightly-doped regions can be formed in the substrate below the nitride layer. Subsequently, a spacer is formed on a sidewall of the gate structure to cover the nitride layer. Afterwards, source/drain regions are formed in the substrate at two sides of the spacer. In one aspect, the two lightly-doped regions are symmetrically formed in the substrate at two sides of the nitride layer. In another aspect, the two lightly-doped regions are respectively formed in the substrate at a side of the nitride layer, and the substrate below the nitride layer and extending to another side of the nitride layer.

In one embodiment, a material of the gate conductive layer is for example polysilicon or doped polysilicon.

In one embodiment, a thickness of the gate dielectric layer is in the range from 1.50 angstroms to 180 angstroms.

In one embodiment, a horizontal depth of the opening is in the range from 100 angstroms to 500 angstroms.

In one embodiment, the first oxide layer and the second oxide layer have a same thickness, and the thickness is in the range from 60 angstroms to 70 angstroms.

In one embodiment, the part of the nitride layer formed in the opening has a thickness in the range from 30 angstroms to 40 angstroms.

A method for manufacturing a non-volatile memory in accordance with one embodiment of the present invention is provided. Firstly, a gate structure is formed on a substrate. The gate structure includes a gate dielectric layer and a gate conductive layer. Then, a part of the gate dielectric layer is removed, so that a symmetrical opening is formed among the gate conductive layer, the substrate and the gate dielectric layer, and a cavity is formed on two end sides of the gate dielectric layer. Afterwards, a first oxide layer is formed on a sidewall and bottom of the gate conductive layer, and a second oxide layer is formed on a surface of the substrate. Thereafter, a nitride material layer is formed covering the gate structure, the first oxide layer, the second oxide layer and the substrate and filling into the opening. Next, an etching process is performed to remove a part of the nitride material layer, so that an L-shaped nitride layer is formed with a vertical part extending along the sidewall of the gate conductive layer and a horizontal part extending into the opening. A height of the vertical part of the nitride layer is below a top surface of the gate conductive layer. Finally, a spacer is formed on a sidewall of the gate structure to completely cover the nitride layer.

In one embodiment, after forming the nitride layer, two lightly-doped regions can be formed in the substrate below the nitride layer. Subsequently, source/drain regions are formed in the substrate at two sides of the spacer. In one aspect, the two lightly-doped regions are symmetrically formed in the substrate at two sides of the nitride layer. In another aspect, the two lightly-doped regions are respectively formed in the substrate uncovered by the nitride layer, and in the substrate partially covered by the nitride layer.

In one embodiment, a thickness of the gate dielectric layer is in the range from 150 angstroms to 180 angstroms.

In one embodiment, a horizontal depth of the opening is in the range from 100 angstroms to 500 angstroms.

In one embodiment, the first oxide layer and the second oxide layer have a same thickness, and the thickness is in the range from 60 angstroms to 70 angstroms.

In one embodiment, the part of the nitride layer formed in the opening has a thickness in the range from 30 angstroms to 40 angstroms.

Owing to the fact that the present embodiments do not adopt the conventional solution of replacing the gate dielectric layer by the ONO structure, the present embodiments can be compatible with the current logic process and would not negatively influence the efficiency of the memory device. In addition, in the non-volatile memory of the present invention, a part of the nitride layer (charge trap layer) is formed between the gate conductive layer and the substrate, so that the problem of encountering electron drift can thereby be avoided and would not negatively affect or influence the operation speed and charge storage capability of the memory device, and further can achieve relatively high efficiency of programming/erasing at lower operation voltage. Moreover, the manufacturing method of the present invention would not increase the amount of photo mask and thus would not increase the process complexity.

BRIEF DESCRIPTION OF THE DRAWINGS

These and other features and advantages of the various embodiments disclosed herein will be better understood with respect to the following description and drawings, in which like numbers refer to like parts throughout, and in which.

DETAILED DESCRIPTION

Figure 1:
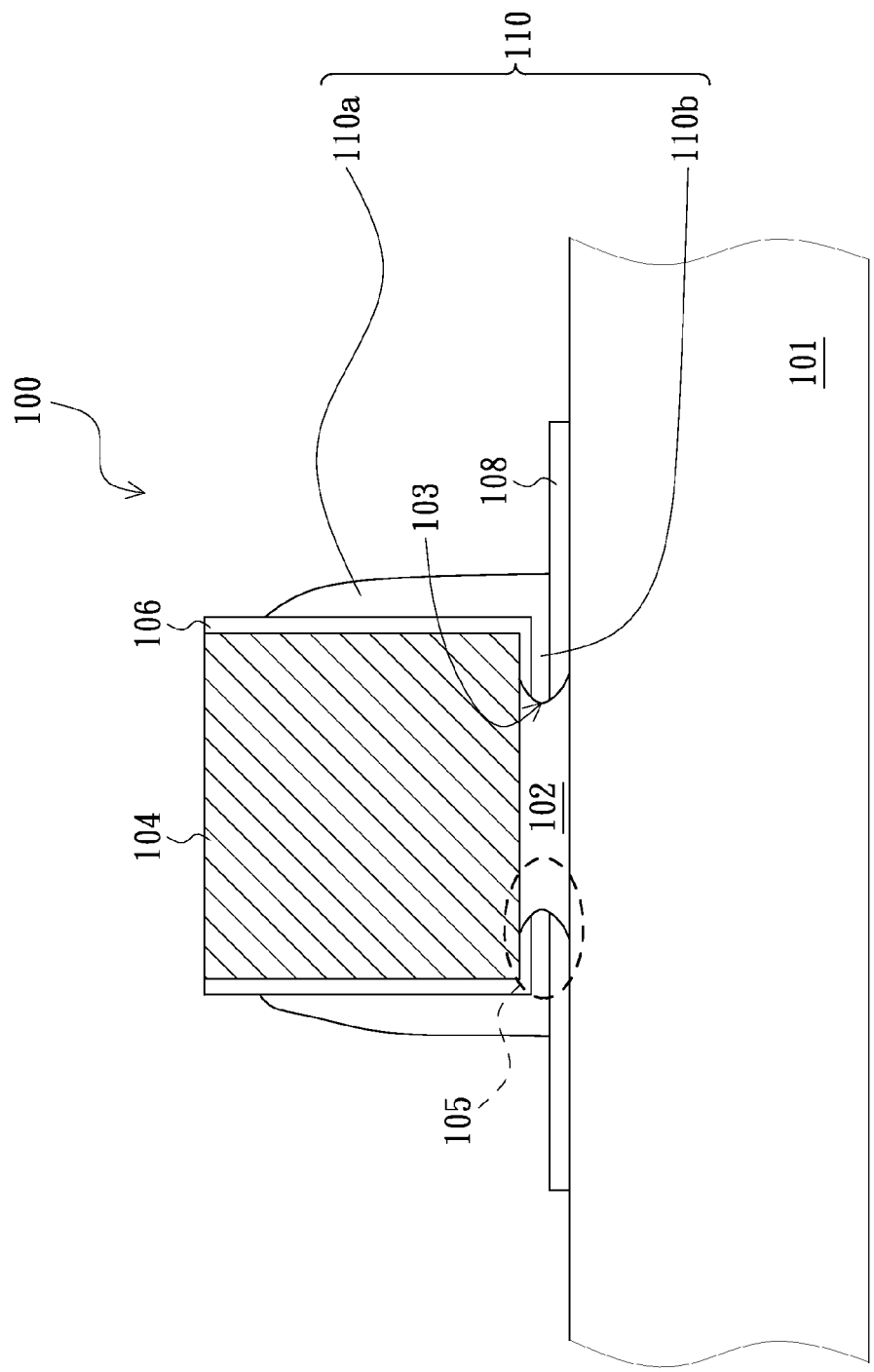
FIG. 1 is a schematic cross-sectional view of a non-volatile memory in accordance with an embodiment of the present invention.

A better understanding of the above and many other features and advantages of the novel non-volatile memory and manufacturing method thereof of the present invention may be obtained from a consideration of the detailed description of some exemplary embodiments thereof below, particularly if such consideration is made in conjunction with the appended drawings, wherein like reference numerals are used to identify like elements illustrated in one or more of the figures thereof.

FIG. 1 illustrates a schematic cross-sectional view of a non-volatile memory in accordance with an embodiment of the present invention.

As illustrated in FIG. 1, a non-volatile memory 100 includes a substrate 101, a gate dielectric layer 102, a gate conductive layer 104, a first oxide layer 106, a nitride layer 110 and a second oxide layer 108. The substrate 101 is for example a silicon substrate. The gate dielectric layer 102 is disposed on the substrate 101. The gate dielectric layer 102 has a cavity 103 formed on two end sides thereof. The gate dielectric layer 102 is for example made of silicon oxide. The gate dielectric layer 102 has a thickness for example in the range from 150 angstroms to 180 angstroms.

The gate conductive layer 104 is disposed on the gate dielectric layer 102. A bottom width of the gate conductive layer 104 is greater than a bottom width of the gate dielectric layer 102. Moreover, the gate conductive layer 104, the substrate 101 and the gate dielectric layer 102 cooperatively constitute a symmetrical opening 105. A horizontal depth of the opening 105 is for example about 200 angstroms and preferably in the range from 100 angstroms to 500 angstroms. The gate conductive layer 104 is made of a material for example polysilicon or doped polysilicon and serves as a control gate of the non-volatile memory 100.

The nitride layer 110 of the non-volatile memory 100 serves as a charge trap layer of memory device for storing charges. The nitride layer 110 is disposed on a sidewall of the gate conductive layer 104, and extended into the opening 105. As shown in FIG. 1, the nitride layer 110 has an L-shape, and is formed comprising a vertical part 110a extending along the sidewall of the gate conductive layer 104 and a horizontal part 110b extending into the opening 105. In addition, a height of the vertical part 110a of the L-shaped nitride layer 110 is below or lower than a top surface of the gate conductive layer 104. A material of the nitride layer 110 is for example silicon nitride. A thickness of the horizontal part 110b of the nitride layer 110 extending into the opening 105 is for example in the range from 30 angstroms to 40 angstroms.

The first oxide layer 106 is disposed among the gate conductive layer 104, the nitride layer 110 and the gate dielectric layer 102, and also is formed on the sidewall and the bottom of the gate conductive layer 104. A material of the first oxide layer 106 is for example silicon oxide. A thickness of the first oxide layer 106 is for example in the range from 60 angstroms to 70 angstroms. The second oxide layer 108 is disposed among the substrate 101, the gate dielectric layer 104 and the nitride layer 110 and also is formed on the substrate 101. A material of the second oxide layer 108 is for example silicon oxide. A thickness of the second oxide layer 108 is for example in the range from 60 angstroms to 70 angstroms.

The second oxide layer 108 and the first oxide layer 106 of the non-volatile memory 100 serve as a charge tunnel layer and a charge block layer, respectively. The second oxide layer 108, the first oxide layer 106 and the nitride layer 110 cooperatively constitute an oxide-nitride-oxide (ONO) structure, and the gate conductive layer 104, the ONO structure and the substrate 101 together as a whole are called a SONOS (i.e., generally called as polysilicon-oxide-nitride-oxide-silicon) memory.

It is noted that, compared with a conventional planar type SONOS memory using an ONO structure to replace the gate dielectric layer, the ONO structure of the present embodiment would not negatively influence the fabrication of the gate dielectric layer, and thus can relatively reduce the process complexity.

In addition, in the non-volatile memory associated with the present invention, the gate conductive layer 104 and the substrate 101 have a part or portion of the nitride layer 110 disposed therebetween. Therefore, compared with a conventional sidewall type SONOS memory, the present non-volatile memory can avoid encountering the issue of electron drift and thus would not negatively influence the operation speed and charge storage capability of the memory device.

Figure 2:
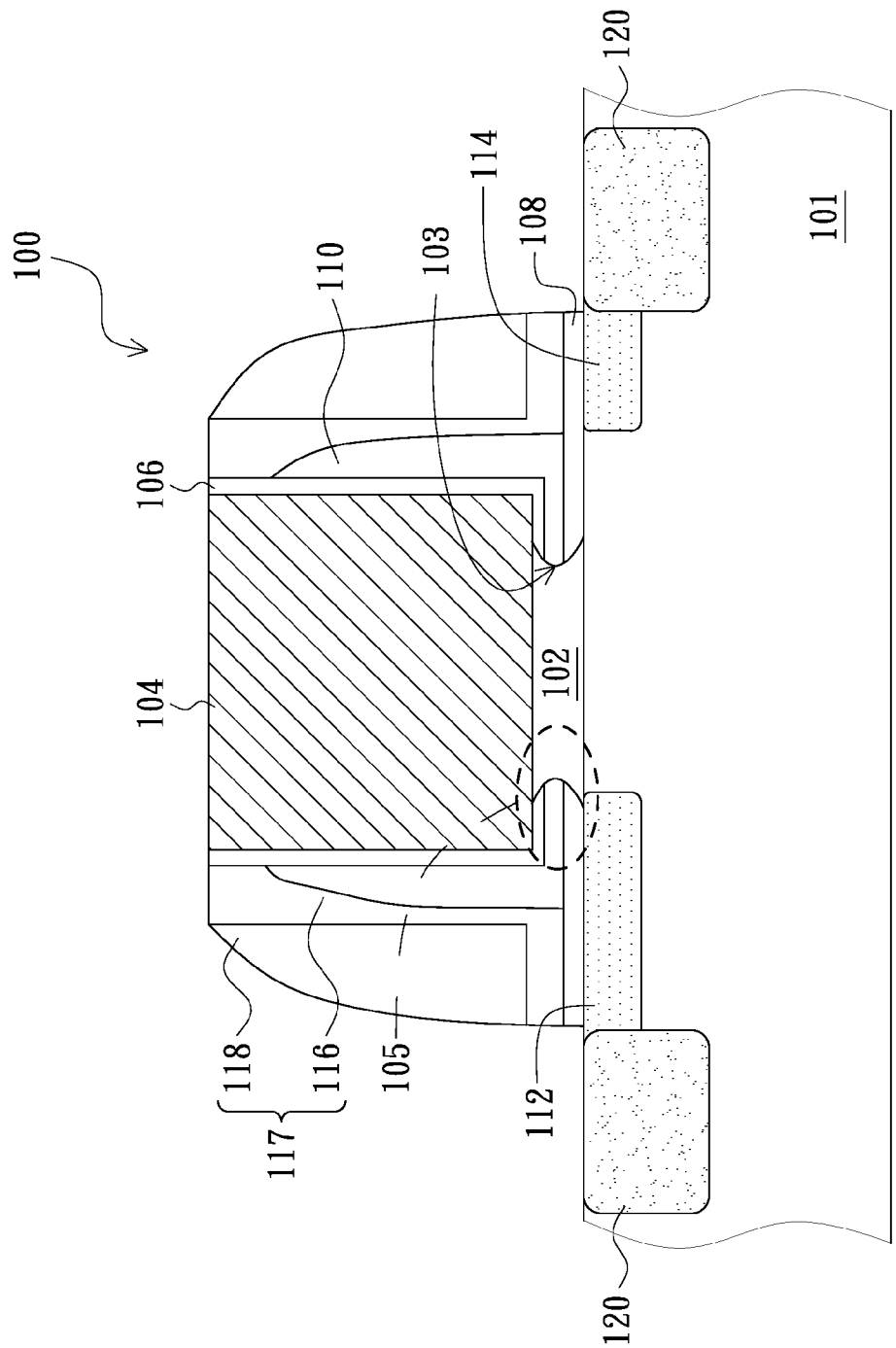
FIG. 2 is a schematic cross-sectional view of a non-volatile memory in accordance with another embodiment of the present invention.

Referring to FIG. 2, which illustrates a schematic cross-sectional view of a non-volatile memory in accordance with another embodiment of the present invention.

As illustrated in FIG. 2, the non-volatile memory 100 further includes two lightly-doped regions 112, 114, a spacer 117 and a plurality of source/drain regions 120 located besides the structural elements illustrated in FIG. 1. The lightly-doped region 114 is disposed in the substrate 101 at a side of the nitride layer 110. The lightly-doped region 112 is disposed in the substrate 101 below the nitride layer 110 and extending to the other side of the nitride layer 110.

The spacer 117 is disposed on the nitride layer 110 on the sidewall of the gate conductive layer 104 as well as being disposed on the substrate 101. Furthermore, it is illustrated in FIG. 2 that the spacer 117 completely covers the L-shaped nitride layer 110. The spacer 117 is for example a composite material layer which including of a silicon oxide 116 and a silicon nitride 118. The source/drain regions 120 are respectively disposed in the substrates 101 at two opposite sides of the spacer 117.

The lightly-doped region 112 and the lightly-doped region 114 of the illustrated embodiment of the present non-volatile memory 100 constitute two asymmetrical lightly-doped regions, and as a whole, can be used for storing single-byte data.

Figure 3:
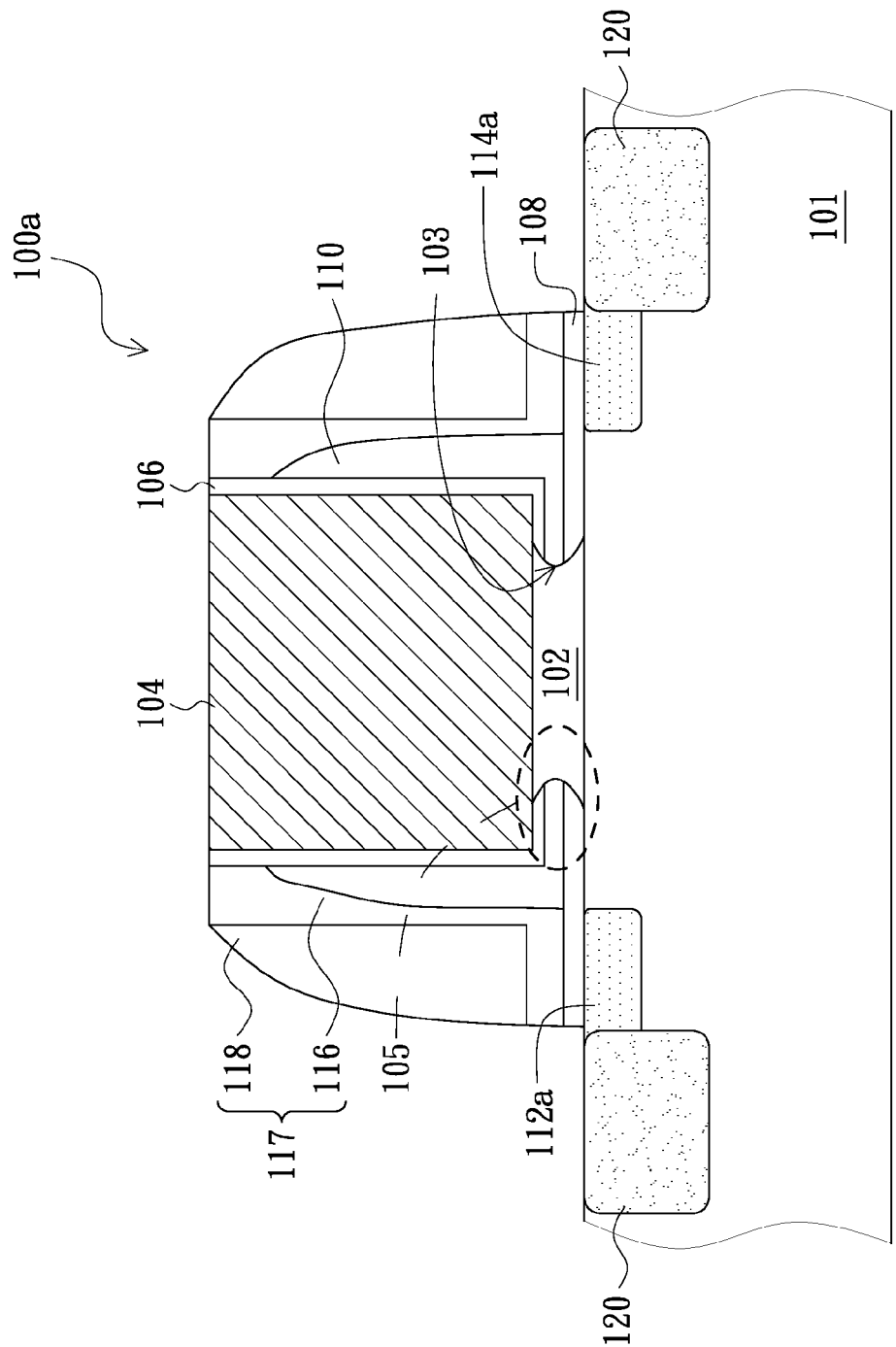
FIG. 3 is a schematic cross-sectional view of a non-volatile memory in accordance with still another embodiment of the present invention.

Referring to FIG. 3, which illustrates a schematic cross-sectional view of a non-volatile memory in accordance with a still another embodiment of the present invention. As illustrated in FIG. 3, a difference between a non-volatile memory 100a and the non-volatile memory 100 as illustrated in FIG. 2 is the following: a lightly-doped region 112a and another lightly-doped region 114a of the non-volatile memory 100a are symmetrically disposed in the substrates 101 at two sides of the nitride layer 110 and as a whole can be used for storing two-byte data.

In the following descriptions, a method for manufacturing a non-volatile memory in accordance with an embodiment of the present invention will be described in detail. Specifically, FIGS. 4A through 4H illustrate process cross-sectional views of an exemplary method for manufacturing a non-volatile memory of the embodiment of the present invention.

Figure 4A:
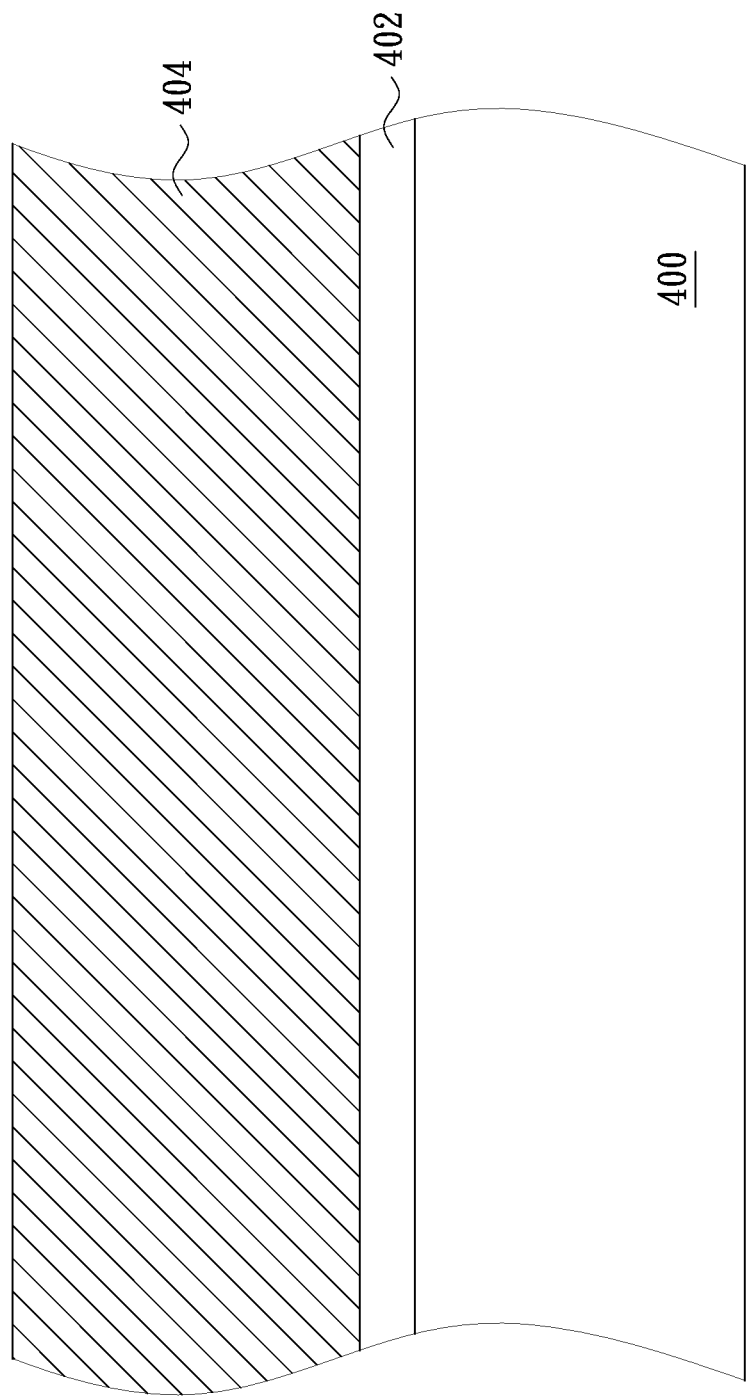
FIGS. 4A through 4H are process cross-sectional views of a manufacturing method of a non-volatile memory in accordance with an embodiment of the present invention.

Firstly, as illustrated in FIG. 4A, a substrate 400 is provided. The substrate 400 is for example a silicon substrate. A gate dielectric material layer 402 then is formed on the substrate 400. The gate dielectric material layer 402 is for example an oxide layer made of silicon oxide. A formation method of the gate dielectric material layer 402 is for example a thermal oxidation method. A thickness of the gate dielectric material layer 402 is for example in the range from 150 angstroms to 180 angstroms.

Afterwards, still referring to FIG. 4, a gate conductive material layer 404 is formed on the gate dielectric material layer 402. A material of the gate conductive material layer 404 is for example polysilicon or doped polysilicon. A formation method of the gate conductive material layer 404 is for example the following: using a chemical vapor deposition process to form an un-doped polysilicon layer and then performing an ion implantation process, or using a chemical vapor deposition process cooperative with an in-situ implantation of dopant.

Figure 4B:
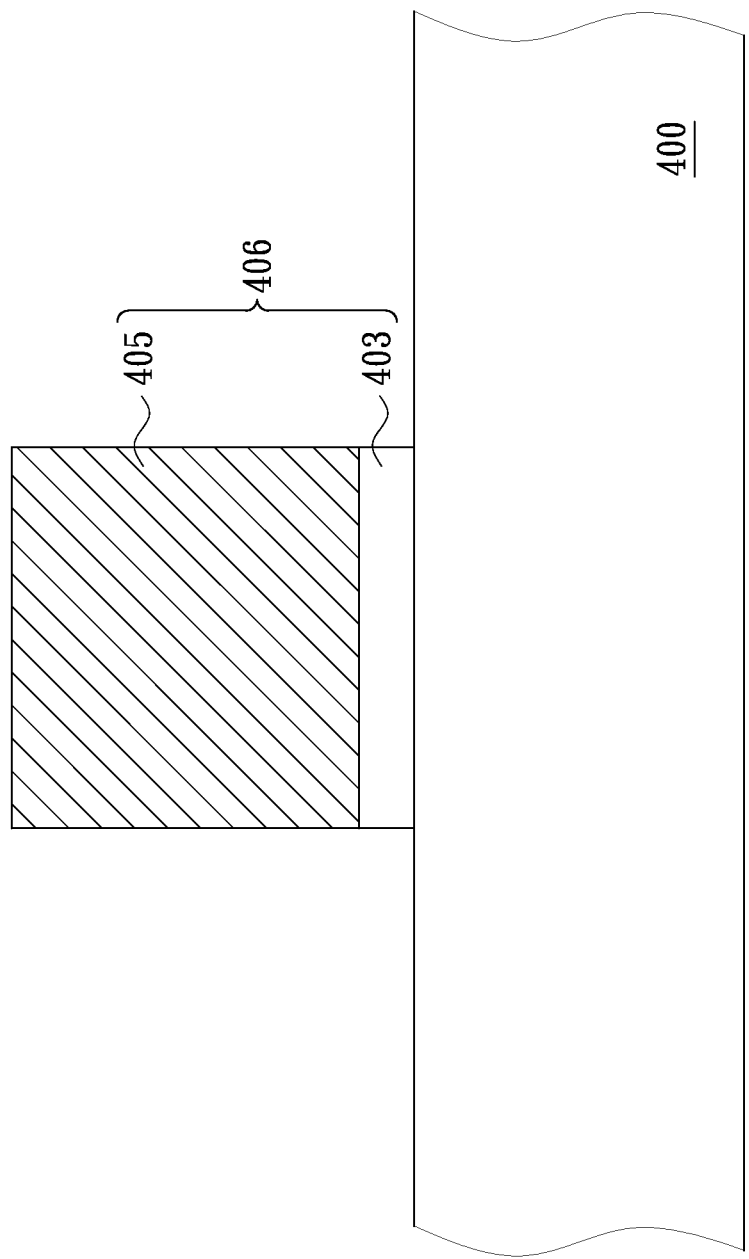

Subsequently, as illustrated in FIG. 4B, the gate conductive material layer 404 and the gate dielectric material layer 402 are patterned to form a gate structure 406. The gate structure 406 includes a gate conductive layer 405 and a gate dielectric layer 403. The gate conductive layer 405 serves as a control gate. The method of patterning is for example the following: firstly forming a patterned photoresist layer (not shown) on the gate conductive material layer 404, then taking the patterned photoresist layer as a mask to perform an etching process for partly removing the gate conductive material layer 404 and the gate dielectric material layer 402, and thereby forming the gate structure 406 consisted of the gate conductive layer 405 and the gate dielectric layer 403. Afterwards, the patterned photoresist layer is removed.

Figure 4C:
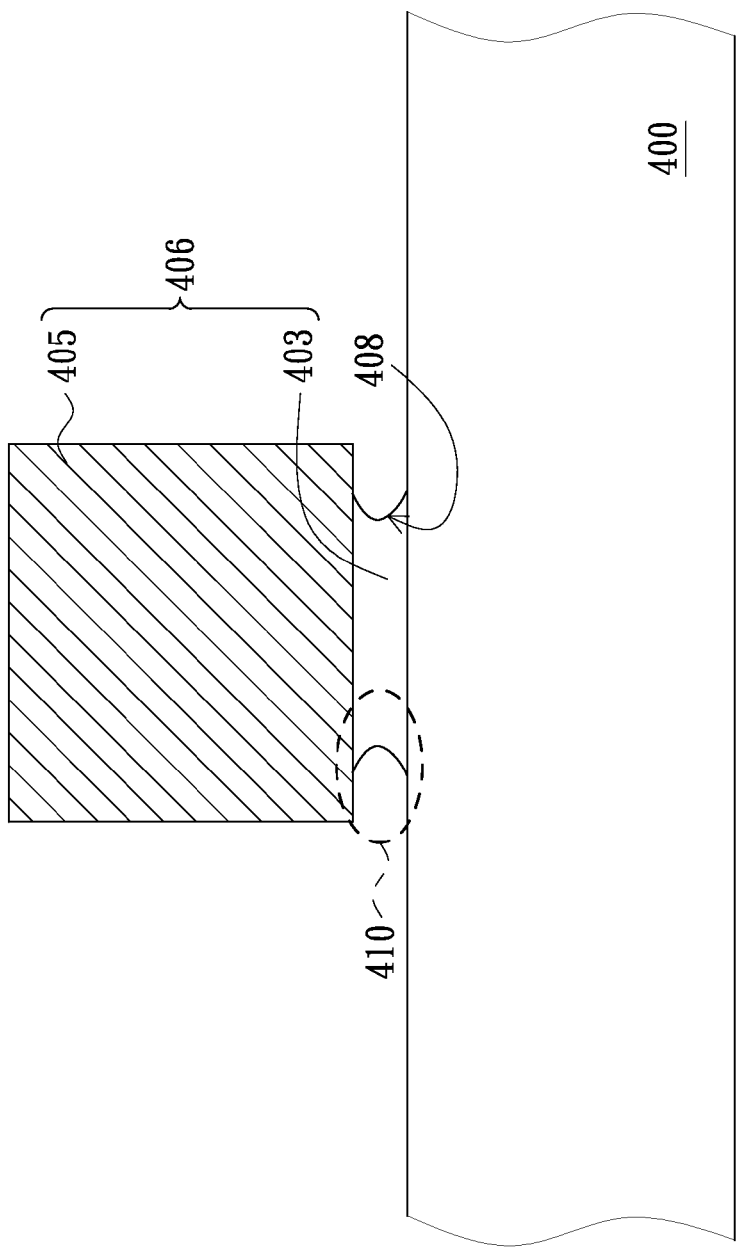

Referring to FIG. 4C, the gate dielectric layer 403 is partly removed to form a cavity 408 on two end sides of the gate dielectric layer 403. Moreover, after the gate dielectric layer 403 is partly removed, a symmetrical opening 410 is formed among the gate conductive layer 405, the substrate 400 and the gate dielectric layer 403. A horizontal depth of the opening 410 is for example about 200 angstroms and preferably in the range from 100 angstroms to 500 angstroms. Herein, a method for partly removing the gate dielectric layer 403 is for example performing a wet etching process or a dry etching process.

Figure 4D:
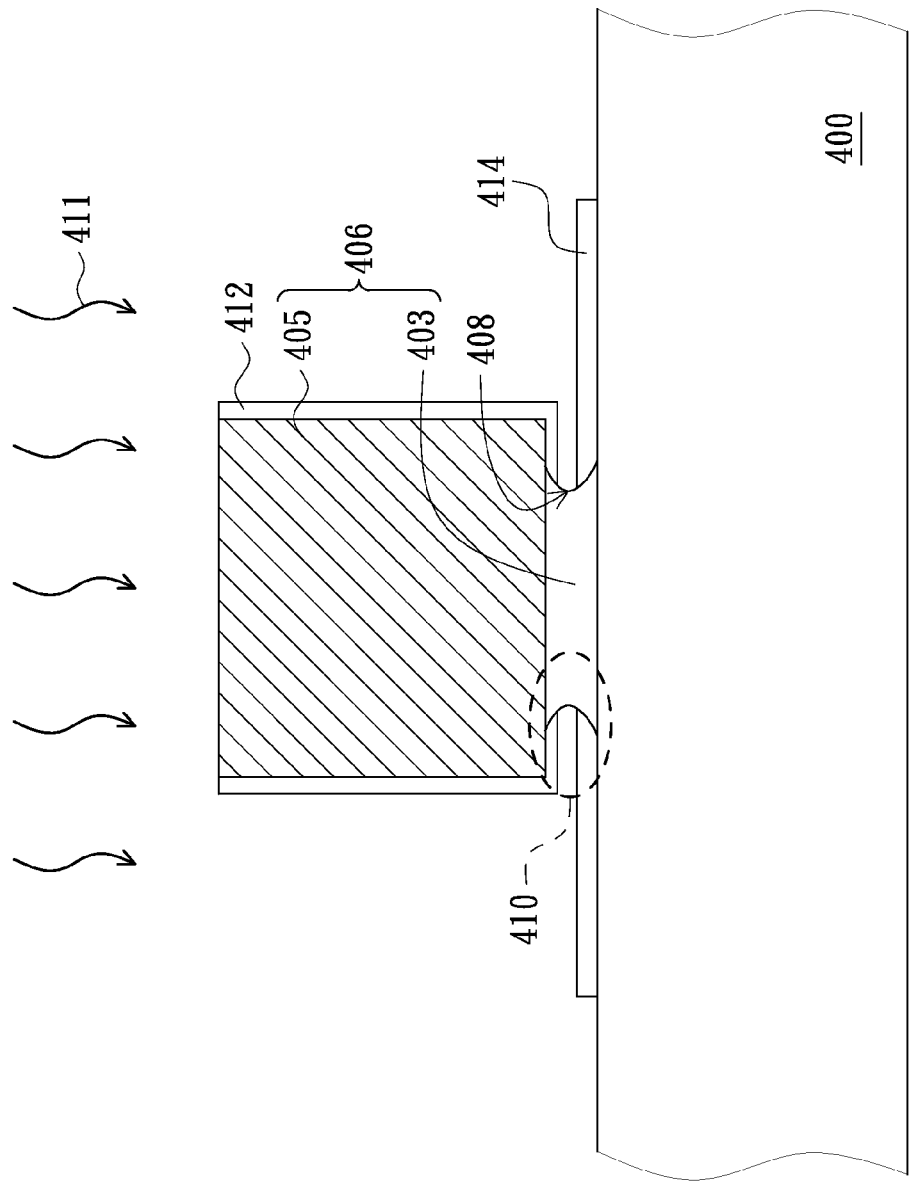

Referring to FIG. 4D, a first oxide layer 412 is formed on a sidewall and bottom of the gate conductive layer 405, and a second oxide layer 414 is formed on a top surface of the substrate 400. A formation method of the first oxide layer 412 and the second oxide layer 414 is for example the following: performing an oxidation process 411 to simultaneously form the first oxide layer 412 and the second oxide layer 414 on the gate conductive layer 405 and the top surface of the substrate 400. The oxidation process 411 is for example a thermal oxidation process, and a process temperature thereof is for example lower than 800 Celsius degrees. A material of the first and second oxide layers 412, 414 is for example silicon oxide, and a thickness thereof is for example in the range from 60 angstroms to 70 angstroms.

Figure 4E:
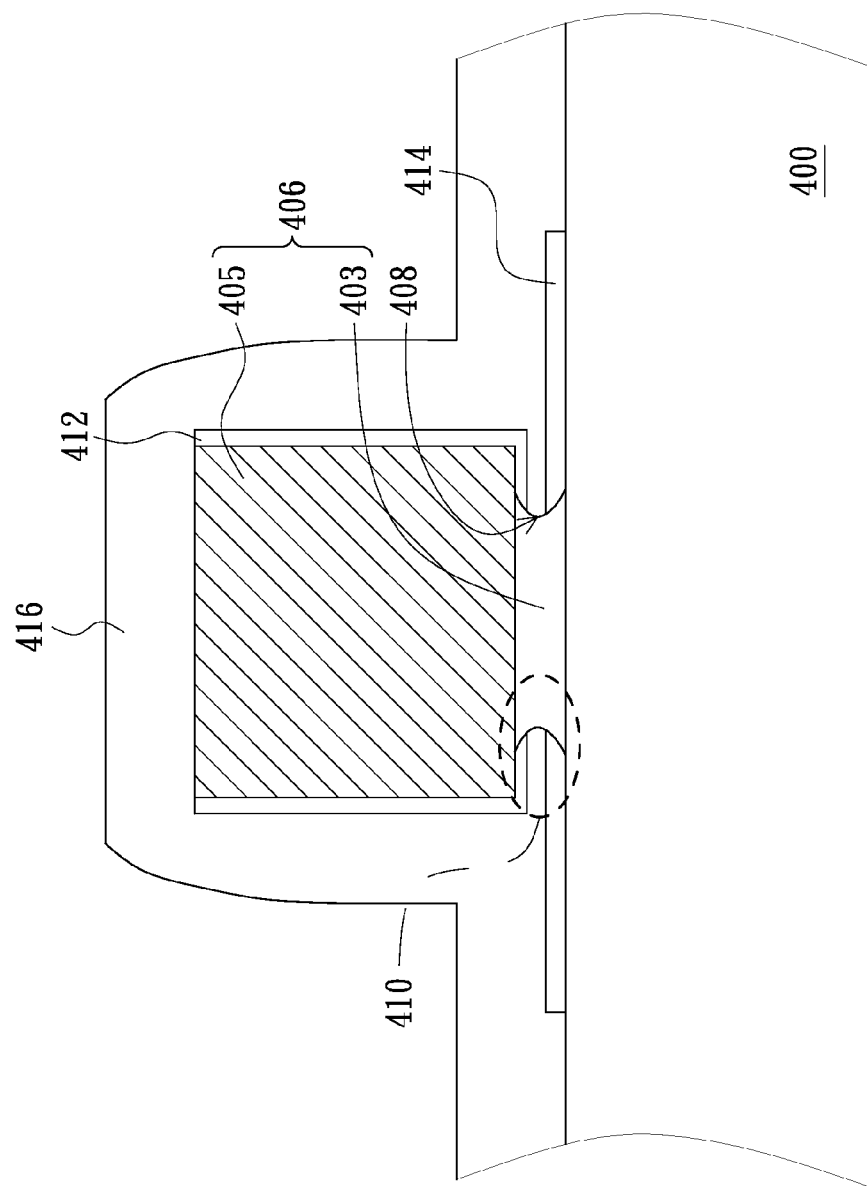

Referring to FIG. 4E, a nitride material layer 416 is formed to be covering the gate structure 406, the first oxide layer 412, the second oxide layer 414 and the substrate 400. The nitride material layer 416 also is filled into the opening 410. A formation method of the nitride material layer 416 is for example a low pressure chemical vapor deposition process, and a material thereof is for example silicon nitride.

Figure 4F:
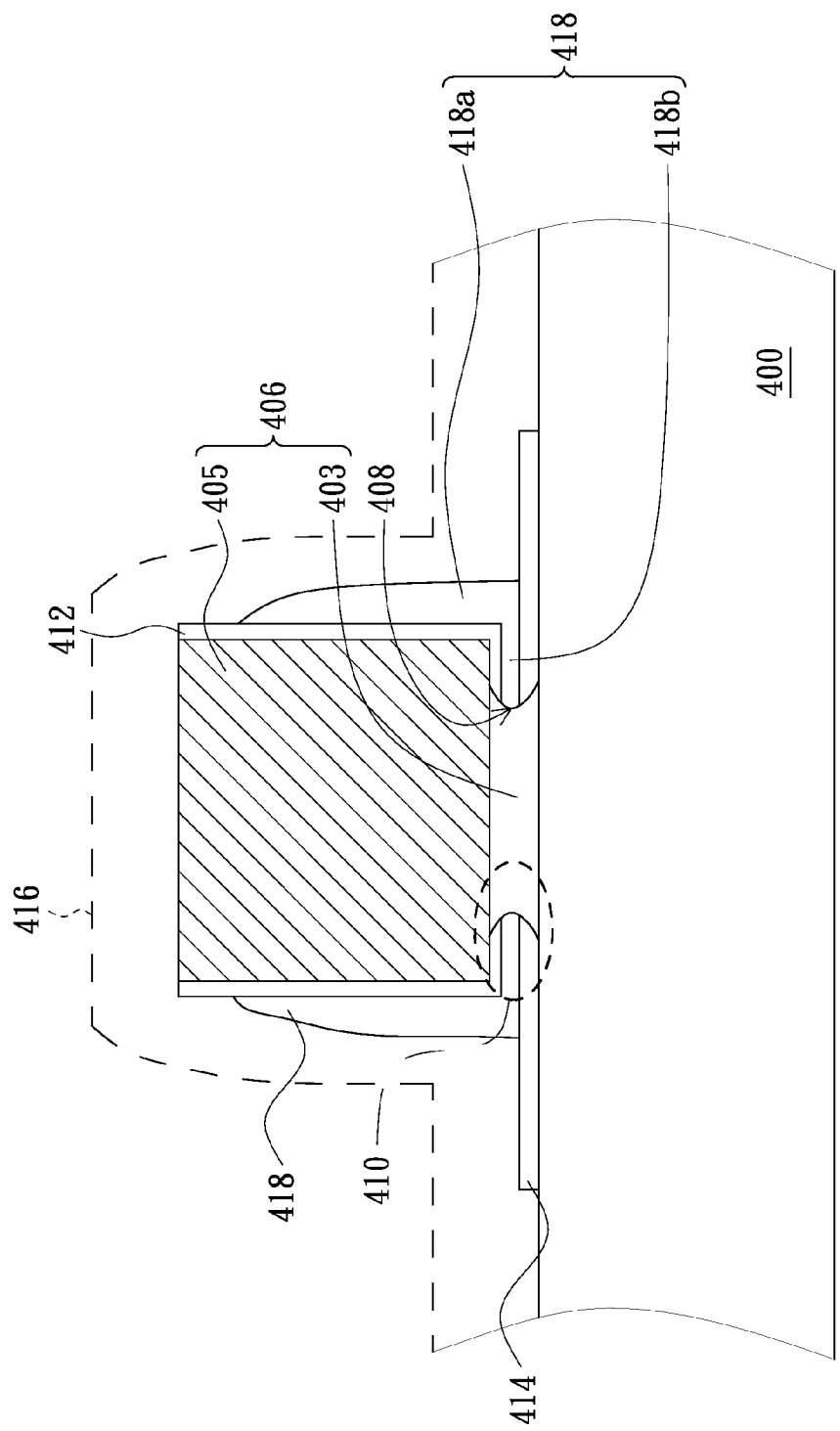

Referring to FIG. 4F, an etching process is performed to partly remove the nitride material layer 416 and thereby forming a nitride layer 418 as an L-shaped integral structure. Especially, as shown in FIG. 4F, the L-shaped nitride layer 418 is formed with a vertical part 418a extending along the sidewall of the gate conductive layer 405 and with a horizontal part 418b extending into the opening 410. In addition, a height of the vertical part 418a of the nitride layer is below a top surface of the gate conductive layer 405. A thickness of the horizontal part 418b of the nitride layer 418 is for example in the range from 30 angstroms to 40 angstroms.

Figure 4G:
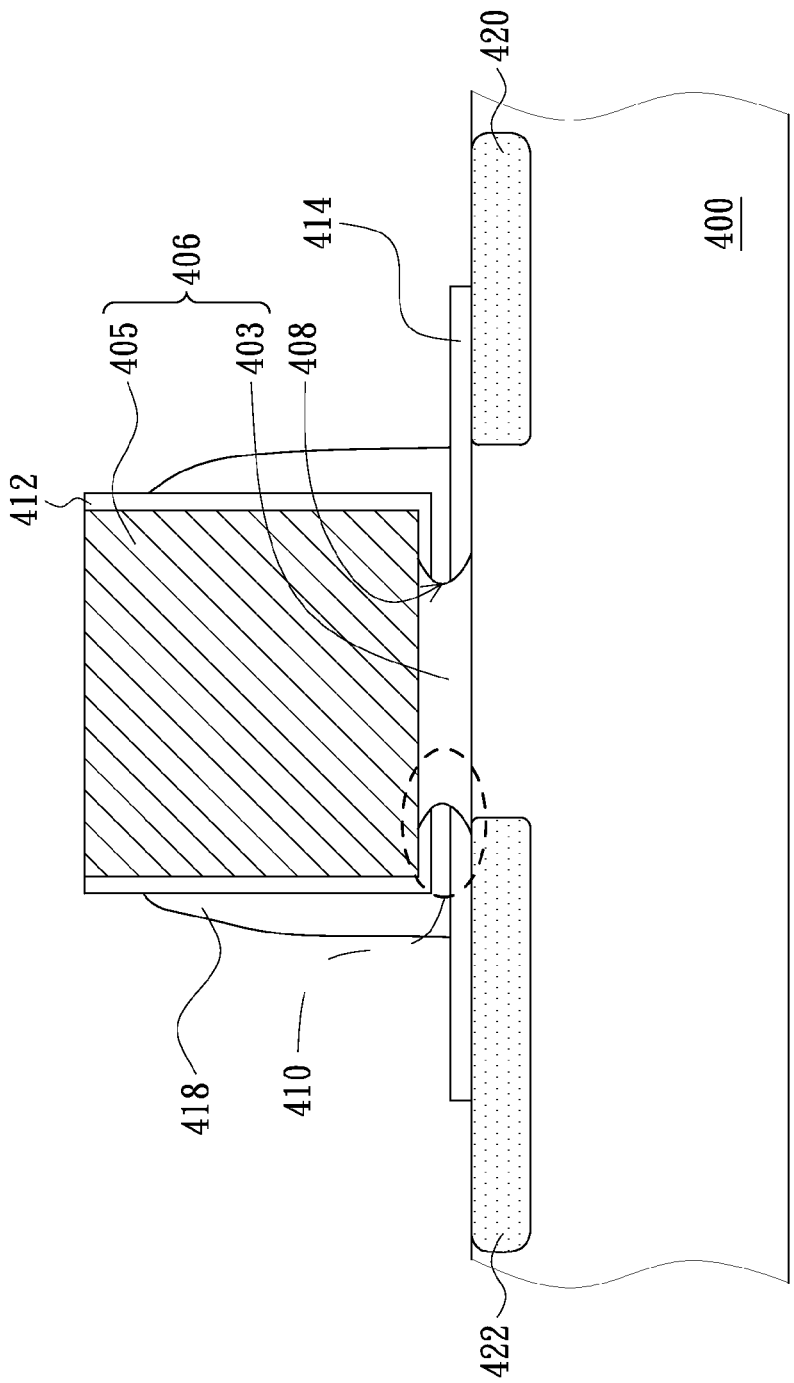

Referring to FIG. 4G, a doping process is performed to form two lightly-doped regions 420, 422 in the substrate 400. As shown in FIG. 4G, the lightly-doped region 420 is formed in the substrate 400 at a side of the nitride layer 418 so as to be uncovered by the nitride layer 418, and the lightly-doped region 422 is formed in the substrates 400 below the nitride layer 418 and extending to another side of the nitride layer 418 so as to be partially covered by the nitride layer 418. A formation method of the lightly-doped region 422 is for example the following: after performing the doping process, using a tilt-angle implanting method to make the lightly-doped region extend to the channel below the nitride layer 418.

In another embodiment, the two lightly-doped regions can be symmetrically formed in the substrates 400 at two sides of the nitride layer 418 instead.

Figure 4H:
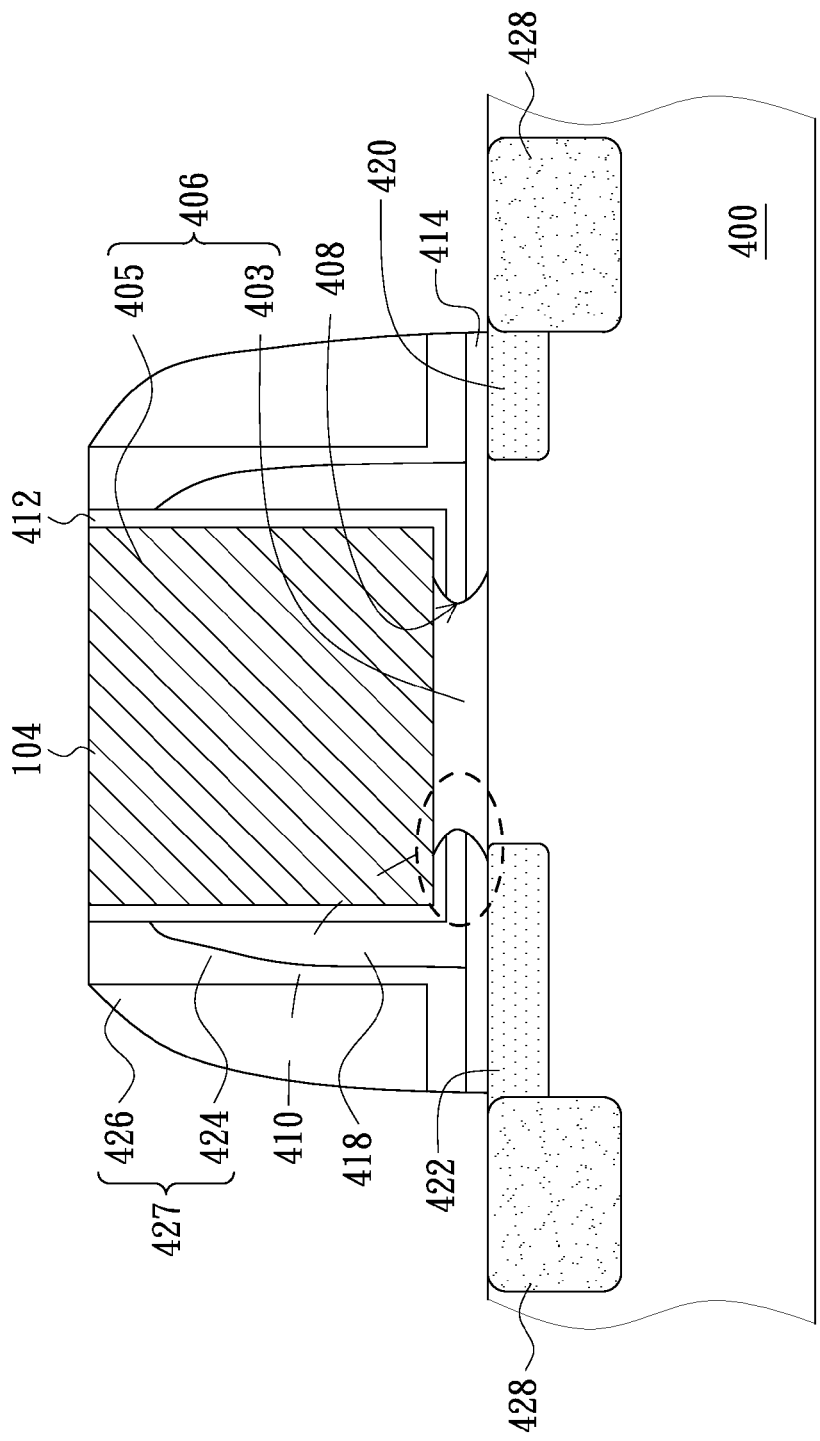

Referring to FIG. 4H, after the formation of the lightly-doped regions 420, 422, several processes for forming a spacer 427 and source/drain regions 428 can be subsequently performed. In the illustrated embodiment, the spacer 427 is formed on a sidewall of the gate structure 406 to completely cover the nitride layer 418, as shown in FIG. 4H. The spacer 427 is for example a composite layer consisted of a silicon oxide layer 424 and a silicon nitride layer 426. Methods for forming the spacer 427 and the source/drain regions 428 can adopt the conventional methods, and thus will not be repeated herein.

As seen from the above descriptions, the present manufacturing method of a non-volatile memory does not completely replace the gate dielectric layer with the ONO structure and thus is different from the conventional method taught in the prior art. Accordingly, the present manufacturing method can be compatible with the current logic process and thus would not negatively influence the efficiency of the logic device.

In the present manufacturing method, by etching the gate dielectric layer to facilitate a part of the nitride layer to be formed between the gate conductive layer and the substrate, and utilizing the oxidation process to simultaneously form the oxide layers on the top and bottom of the nitride layer, the ONO structure is formed consequently. Accordingly, the present manufacturing method would not increase the amount of photo mask and thus would not increase the process complexity, and furthermore would not encounter the issue of electron drift.

In the following, an integration process of the present manufacturing method of a non-volatile memory and a current logic process will be described in detail.

FIGS. 5A through 5E illustrate process cross-sectional views of integration of a current logic process and a non-volatile memory in accordance with another embodiment of the present invention.

Figure 5A:
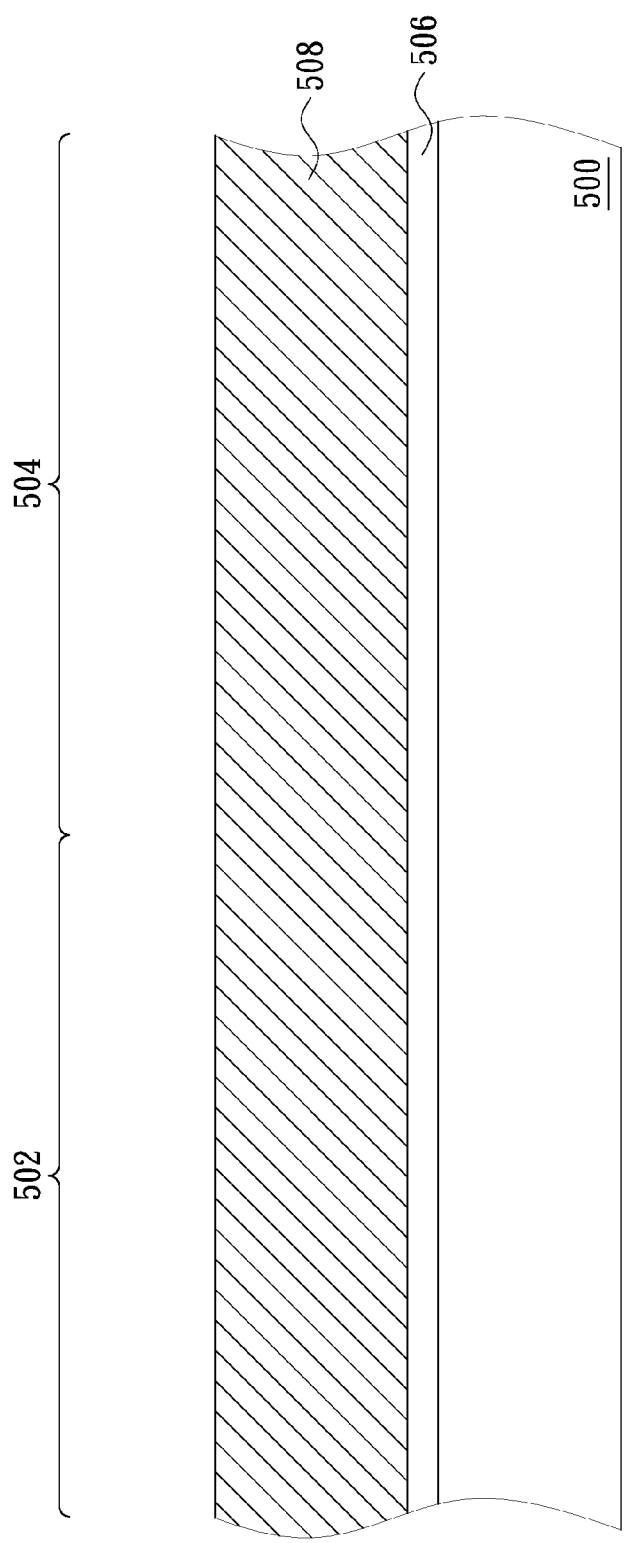
FIGS. 5A through 5E are process cross-sectional views of integration of a current logic process and a non-volatile memory in accordance with an embodiment of the present invention.

Firstly, as illustrated in FIG. 5A, a substrate 500 defined with a logic device region 502 and a memory region 504 is provided, and a gate dielectric material layer 506 and a gate conductive material layer 508 are sequentially formed on the substrate 500.

Figure 5B:
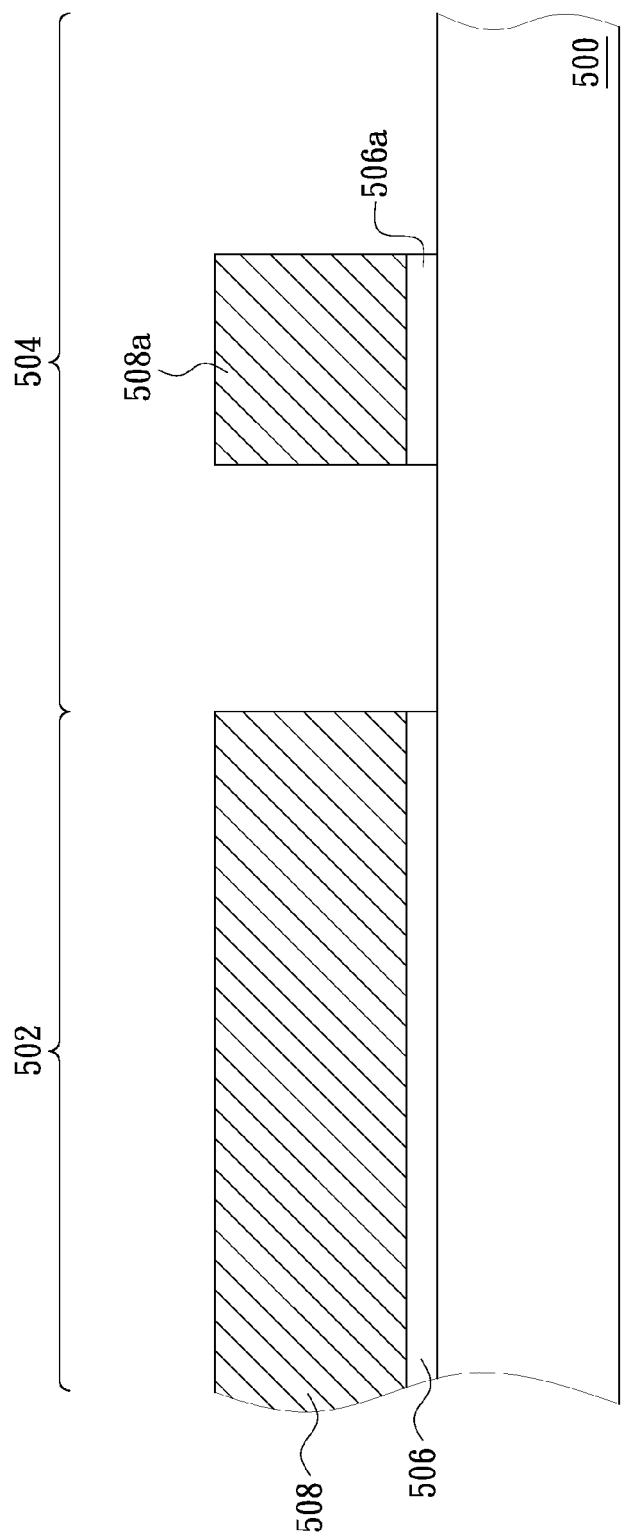

Referring to FIG. 5B, a covering layer (not shown) is firstly formed on the gate conductive material layer 508 in the logic device region 502 of the substrate 500. Afterwards, the gate conductive material layer 508 and the gate dielectric material layer 506 in the memory region 504 are patterned and whereby forming a gate conductive layer 508a and a gate dielectric layer 506a.

Figure 5C:
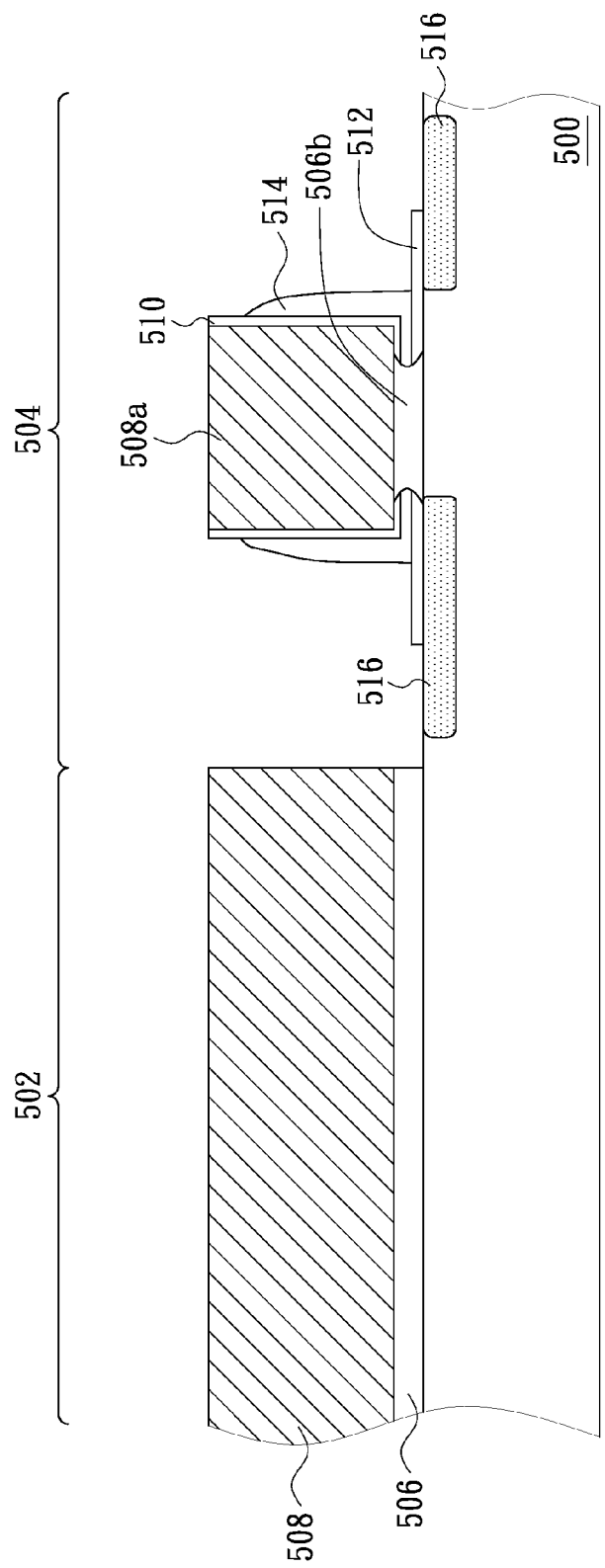

Referring to FIG. 5C, after the gate conductive material layer 508 and the gate dielectric material layer 506 in the memory region 504 are patterned, processes of forming a gate dielectric layer 506b, a first oxide layer 510, a second oxide layer 512, a nitride layer 514 and lightly-doped regions 516, 518 are performed. The formation methods of the gate dielectric layer 506b, the first oxide layer 510, the second oxide layer 512, the nitride layer 514 and the two lightly-doped regions 516, 518 can be the same as those described in the above-mentioned manufacturing method of a non-volatile memory, and thus will not be repeated herein.

Figure 5D:
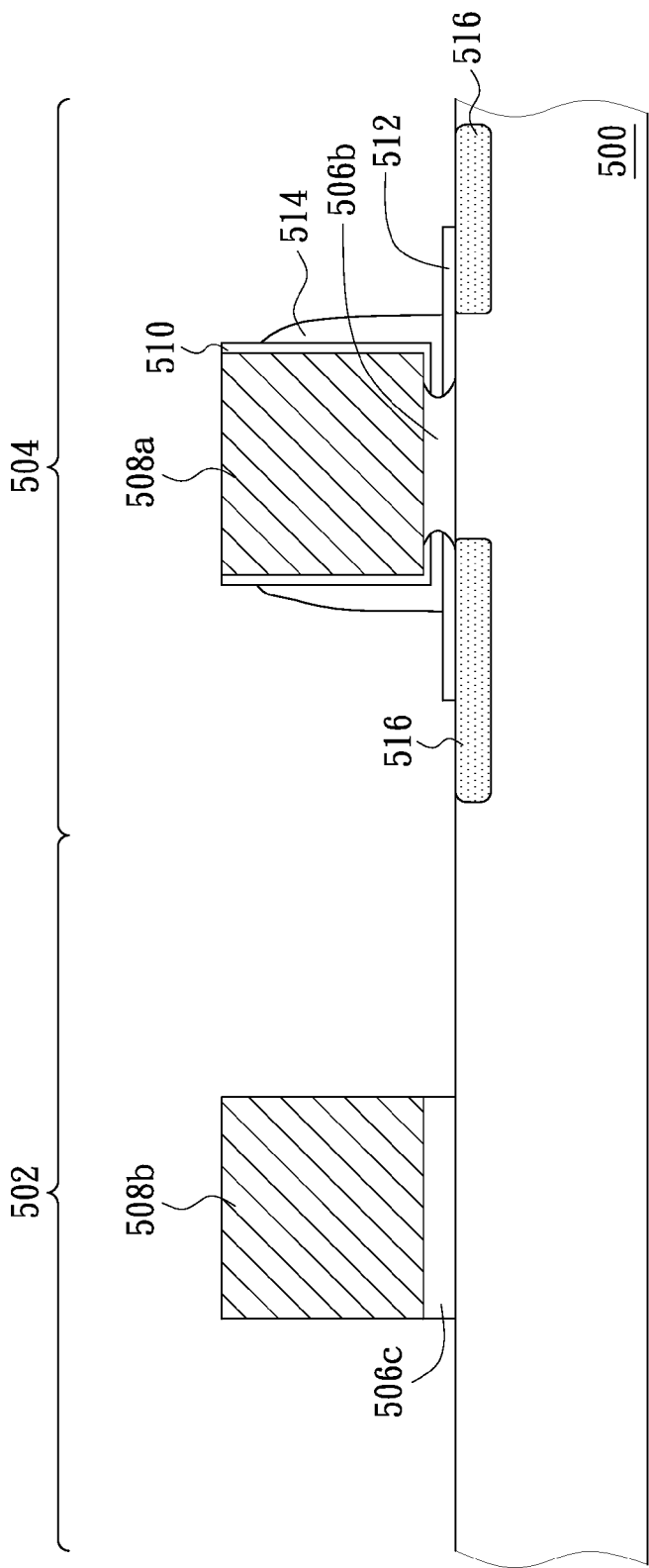

It is understood that, after finishing the above manufacturing process of the non-volatile memory, a general logic process can be subsequently performed. In particular, the covering layer (not shown) in the logic device region 502 is removed, and another covering layer (not shown) will be formed in the memory region 504. Afterwards, the gate conductive material layer 508 and the gate dielectric material layer 506 in the logic device region 502 is patterned to form a gate conductive layer 508b and a gate dielectric layer 506c (as shown in FIG. 5D).

Figure 5E:
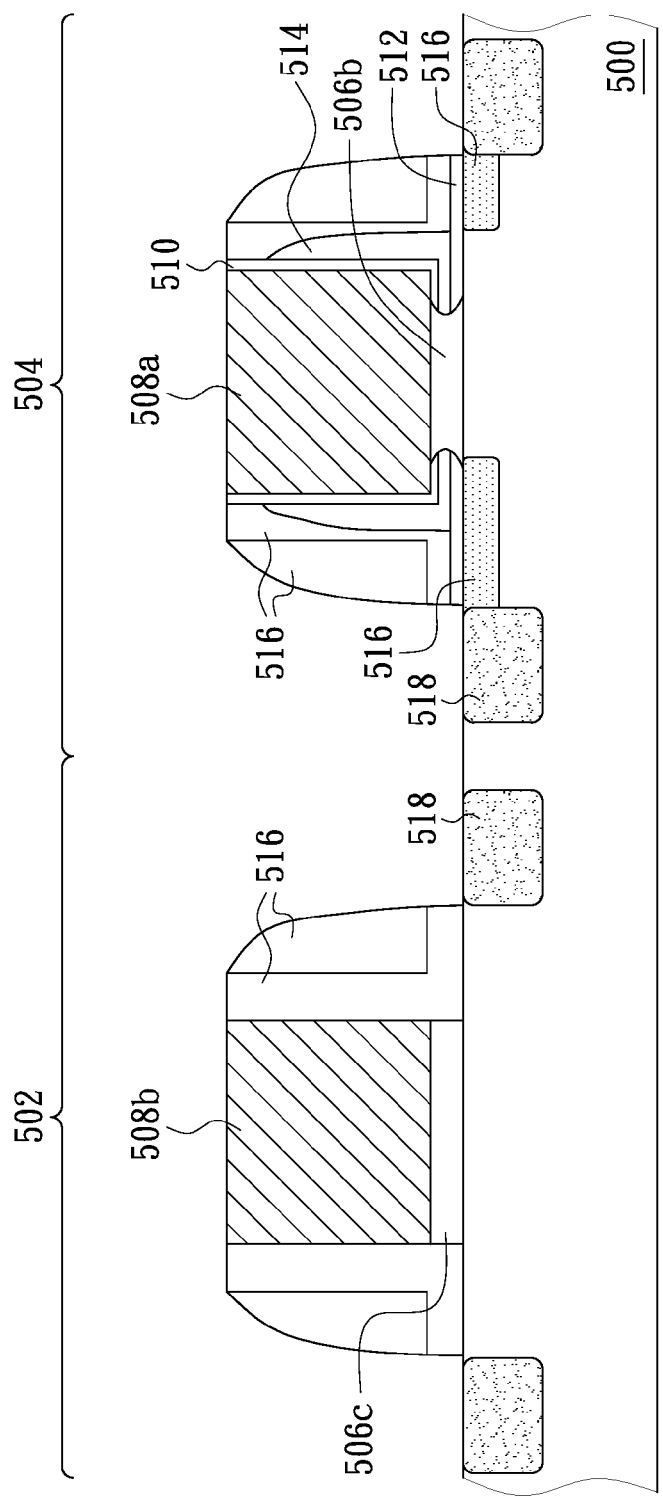

Referring to FIG. 5E, the covering layer in the memory region 504 is removed. A spacer 516 and source/drain regions 518 then are simultaneously formed in each of the logic device region 502 and the memory device region 504.

Subsequently, the memory structure as illustrated in FIG. 2 is taken as an example to illustrate an operation method of the non-volatile memory in accordance with the present invention.

Referring back to FIG. 2, the operation method of the non-volatile memory 100 is as follow: during programming, the one on the right hand side (referred herein as the right one) of the source/drain regions 120 is applied with a bias-voltage for example about +3V~+5V, the one on the left hand side (referred herein as the left one) of the source/drain regions 120 is applied with a bias-voltage for example 0V, the gate conductive layer 104 is applied with a bias-voltage for example +6V, and the substrate 101 is applied with a bias-voltage for example 0V or about −1~−2V, so that electrons can be injected into the nitride layer (charge trap layer) 110 adjacent to the right one of the source/drain regions 120 by channel hot electron injection.

During erasing, the right one of the source/drain regions 120 can be applied with a bias-voltage for example about +3V~+5V, the left one of the source/drain regions 120 is applied with a bias-voltage for example 0V, the gate conductive layer 104 is applied with a bias-voltage for example −6V, and the substrate 101 is applied with a bias-voltage for example 0V, which facilitates to erase the previously stored data by a Fowler-Nordheim (F-N) tunneling effect or a band to band hot hole injection.

In addition, during reading, the right one of the source/drain regions 120 can be applied with a bias-voltage for example 0V, the left one of the source/drain regions 120 is applied with a bias-voltage for example 1.5V, the gate conductive layer 104 is applied with a positive bias-voltage, and the substrate 101 is applied with a bias-voltage for example 0V, which facilitates to read the data stored in the non-volatile memory 100.

Since in the device structure of the present non-volatile memory, a part of the nitride layer (charge trap layer) is formed between the gate conductive layer and the substrate, therefore, compared with the conventional non-volatile memory, the ONO structure of the present non-volatile memory in accordance with the embodiments of present invention can produce a relatively strong perpendicular electric field and thus can achieve relatively high efficiency of programming/erasing at lower operation voltage.

In summary, the non-volatile memory and the manufacturing method thereof in accordance with the embodiments of the present invention at least can achieve the following advantages of (1)~(4).

(1), the present invention can be compatible with the current logic process, relatively reduce the process complexity and would not negatively influence the efficiency of logic device.

(2), the present invention can avoid encountering the issue of electron drift and would not influence the operation speed and charge storage capability of device.

(3), the manufacturing method of the present invention would not increase the amount of photo mask, and thus would not cause the process to be complicated.

(4), the non-volatile memory of the present invention can achieve relatively high efficiency of programming/erasing at low operation voltage.

The above description is given by way of example, and not limitation. Given the above disclosure, one skilled in the art could devise variations that are within the scope and spirit of the invention disclosed herein, including configurations ways of the recessed portions and materials and/or designs of the attaching structures. Further, the various features of the embodiments disclosed herein can be used alone, or in varying combinations with each other and are not intended to be limited to the specific combination described herein. Thus, the scope of the claims is not to be limited by the illustrated embodiments.

What is claimed is:

1. A method for manufacturing a non-volatile memory, the method comprising steps of:
    forming a gate structure on a substrate, wherein the gate structure comprises a gate dielectric layer and a gate conductive layer;
    removing a part of the gate dielectric layer, and thereby forming a symmetrical opening among the gate conductive layer, the substrate and the gate dielectric layer as well as forming a cavity on two end sides of the gate dielectric layer;
    forming a first oxide layer on a sidewall and bottom of the gate conductive layer, and forming a second oxide layer on a surface of the substrate isolated from the first oxide layer;
    forming a nitride material layer covering the gate structure, the first oxide layer, the second oxide layer and the substrate, filling into the opening, and physically contacting with the gate dielectric layer; and
    performing an etching process to remove a part of the nitride material layer and thereby forming a nitride layer disposed on the sidewall of the gate conductive layer and extending into the opening.

2. The method for manufacturing a non-volatile memory as claimed in claim 1, wherein the step of removing the part of the gate dielectric layer comprises performing a wet etching process or a dry etching process.

3. The method for manufacturing a non-volatile memory as claimed in claim 1, wherein the step of forming the first oxide layer and the second oxide layer comprises performing an oxidation process.

4. The method for manufacturing a non-volatile memory as claimed in claim 1, wherein the step of forming the nitride material layer comprises a low pressure chemical vapor deposition method.

5. The method for manufacturing a non-volatile memory as claimed in claim 1, further comprises, after forming the nitride layer, steps of:
    forming two lightly-doped regions in the substrate below the nitride layer;
    forming a spacer on a sidewall of the gate structure to cover the nitride layer; and
    forming source/drain regions in the substrate at two sides of the spacer.

6. The method for manufacturing a non-volatile memory as claimed in claim 5, wherein the two lightly-doped regions are symmetrically formed in the substrate at two sides of the nitride layer.

7. The method for manufacturing a non-volatile memory as claimed in claim 5, wherein the two lightly-doped regions respectively formed in the substrate at a side of the nitride layer, and the substrate below the nitride layer and extending to another side of the nitride layer.

8. The method for manufacturing a non-volatile memory as claimed in claim 1, wherein a material of the gate conductive layer comprises polysilicon or doped polysilicon.

9. The method for manufacturing a non-volatile memory as claimed in claim 1, wherein a thickness of the gate dielectric layer is in the range from 150 angstroms to 180 angstroms.

10. The method for manufacturing a non-volatile memory as claimed in claim 1, wherein a horizontal depth of the opening is in the range from 100 angstroms to 500 angstroms.

11. The method for manufacturing a non-volatile memory as claimed in claim 1, wherein the first oxide layer and the second oxide layer have a same thickness, and the thickness is in the range from 60 angstroms to 70 angstroms.

12. The method for manufacturing a non-volatile memory as claimed in claim 1, wherein the part of the nitride layer formed in the opening has a thickness in the range from 30 angstroms to 40 angstroms.

13. The method for manufacturing a non-volatile memory as claimed in claim 1, wherein the horizontal part of the nitride layer formed in the opening has a thickness in the range from 30 angstroms to 40 angstroms.

14. A method for manufacturing a non-volatile memory, the method comprising steps of:
    forming a gate structure on a substrate, wherein the gate structure comprises a gate dielectric layer and a gate conductive layer;
    removing a part of the gate dielectric layer, and thereby forming a symmetrical opening among the gate conductive layer, the substrate and the gate dielectric layer as well as forming a cavity on two end sides of the gate dielectric layer;
    forming a first oxide layer on a sidewall and bottom of the gate conductive layer, and forming a second oxide layer on a surface of the substrate isolated from the first oxide layer;
    forming a nitride material layer covering the gate structure, the first oxide layer, the second oxide layer and the substrate, filling into the opening, and physically contacting with the gate dielectric layer;
    performing an etching process to remove a part of the nitride material layer and thereby forming an L-shaped nitride layer with a vertical part extending along the sidewall of the gate conductive layer and a horizontal part extending into the opening physically contacting with the gate dielectric layer, wherein a height of the vertical part of the nitride layer is below a top surface of the gate conductive layer; and
    forming a spacer on a sidewall of the gate structure to completely cover the nitride layer.

15. The method for manufacturing a non-volatile memory as claimed in claim 14, further comprises, after forming the nitride layer, steps of:

forming two lightly-doped regions in the substrate below the nitride layer; and forming source/drain regions in the substrate at two sides of the spacer.

16. The method for manufacturing a non-volatile memory as claimed in claim 15, wherein the two lightly-doped regions are symmetrically formed in the substrate at two sides of the nitride layer.

17. The method for manufacturing a non-volatile memory as claimed in claim 15, wherein the two lightly-doped regions respectively formed in the substrate uncovered by the nitride layer, and in the substrate partially covered by the nitride layer.

18. The method for manufacturing a non-volatile memory as claimed in claim 14, wherein a thickness of the gate dielectric layer is in the range from 150 angstroms to 180 angstroms.

19. The method for manufacturing a non-volatile memory as claimed in claim 14, wherein a horizontal depth of the opening is in the range from 100 angstroms to 500 angstroms.

20. The method for manufacturing a non-volatile memory as claimed in claim 14, wherein the first oxide layer and the second oxide layer have a same thickness, and the thickness is in the range from 60 angstroms to 70 angstroms.

* * * * *